United States Patent [19]

Scovell et al.

[11] Patent Number: 4,772,571
[45] Date of Patent: Sep. 20, 1988

[54] PROCESS OF SELF ALIGNED NITRIDATION OF TISI$_2$ TO FORM TIN/TISI$_2$ CONTACT

[75] Inventors: Peter D. Scovell, Chelmsford; Paul J. Rosser, Harlow; Gary J. Tomkins, Braintree, all of England

[73] Assignee: STC plc, London, United Kingdom

[21] Appl. No.: 50,467

[22] Filed: May 18, 1987

Related U.S. Application Data

[62] Division of Ser. No. 775,529, Sep. 13, 1985, abandoned.

[30] Foreign Application Priority Data

Sep. 14, 1984 [GB] United Kingdom ............... 8423265

[51] Int. Cl.$^4$ .......................................... H01L 21/283
[52] U.S. Cl. ................................... 437/200; 437/246; 437/192; 437/247; 437/174; 148/DIG. 19; 357/71
[58] Field of Search ............... 437/192, 194, 200, 201, 437/246, 247, 178, 173, 174; 357/71; 148/DIG. 19

[56] References Cited

U.S. PATENT DOCUMENTS

| | | | |
|---|---|---|---|
| 4,468,308 | 8/1984 | Scovell et al. | 204/192 R |
| 4,528,744 | 7/1985 | Shibata | 437/34 |
| 4,545,116 | 10/1985 | Law | 437/200 |
| 4,567,058 | 1/1986 | Koh | 427/55 |
| 4,599,196 | 5/1986 | Anderson | 29/591 |
| 4,622,735 | 11/1986 | Shibata | 437/200 |

FOREIGN PATENT DOCUMENTS

A1-0127281 5/1984 European Pat. Off. .

OTHER PUBLICATIONS

C. Y. Ting and M. Wittmer, *Thin Solid Films*, 96 (1982), pp. 327-345.
M. A. Nicollet, *Thin Solid Films*, 52 (1978), pp. 415-445.
C. Y. Ting, *J. Vac. Sci. Technol.*, 21 (1), May/Jun. 1982, pp. 14-18.
P. J. Rossez, G. J. Tomkins, "Self Aligned Nitridation of TiSi$_2$: a TiN/TiSi$_2$ Contact Structure", *Materials Res. Soc. Symp. Proc.*, vol. 37 (Gibson et al. ed.), pp. 607-612, 1985, Mat. Res. Soc.

*Primary Examiner*—Brian E. Hearn
*Assistant Examiner*—T. N. Quach
*Attorney, Agent, or Firm*—Dennis P. Clarke

[57] ABSTRACT

In order to prevent diffusion of silicon from under a titanium disilicide interconnect (1) and into an overlying aluminium layer (6), the disilicide is selectively nitrided by annealing in nitrogen at the points where interconnection between the disilicide and aluminium is required via holes (4) in a silicon dioxide layer (3). The titanium nitrode contacts (5) thus formed in a truly self-aligned manner provide a good barrier to silicon diffusion while having an acceptable low resistivity.

6 Claims, 1 Drawing Sheet

U.S. Patent
Sep. 20, 1988
4,772,571
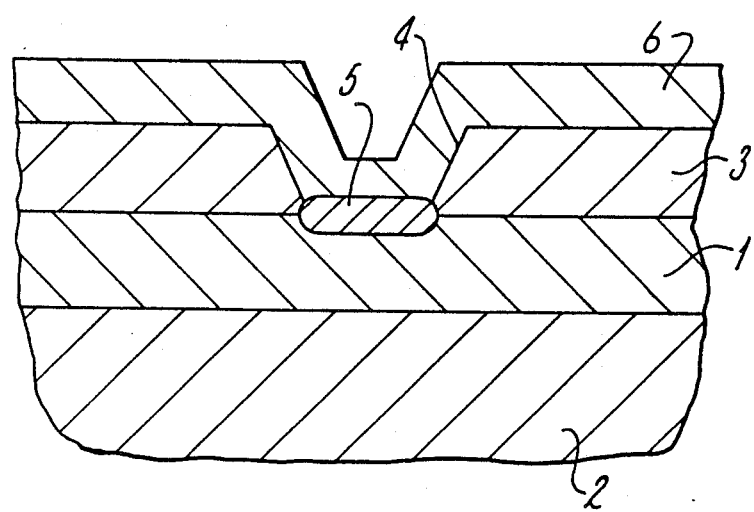

PROCESS OF SELF ALIGNED NITRATION OF TISI₂ TO FORM TIN/TISI₂ CONTACT

This is a division of application Ser. No. 775,529, filed 9/13/85, now abandoned.

BACKGROUND OF THE INVENTION

This invention relates to semiconductor devices and the manufacture thereof and, in particular, to semiconductor devices including silicides.

Polysilicon has conventionally been employed for gates and interconnections in integrated circuits. However, for small geometry, high speed integrated circuits it is desirable to use alternative materials with lower resistivity, such as metallic silicides. Our co-pending GB Applications No. 8328552 (Ser. No. 2139420) (P. D. Scovell et al 5-3-2X) and No. 8312281 (Ser. No. 2139419 (P. D. Scovell et al 7-4-3) describe methods of forming metallic silicide elements.

Titanium disilicide is now one of the most favoured replacements for heavily-doped polysilicon as an interconnect in MOS devices with geometries down to 1 μm. Titanium disilicide has numerous beneficial qualities. It is a refractory metal. It has the lowest thin film resistivity of any refractory silicide. It is readily etched. Metal over the silicide can be etched with great selectivity, and a high quality silicon dioxide layer can be grown over the silicide with no chance of forming volatile metal oxides. One significant disadvantage of this material is that it does not form a barrier to silicon diffusion from beneath the silicide. Thus where aluminium is disposed over silicide, silicon can diffuse up into the aluminium where it can precipitate to form a high resistance layer, and this diffusion is a significant cause of device failure. It is an object of the present invention to overcome this disadvantage.

SUMMARY OF THE INVENTION

According to one aspect of the present invention there is provided a semiconductor device including a metallic silicide element and a metal element in electrical contact therewith via a nitrided region of the metallic silicide element.

According to another aspect of the present invention there is provided a method of manufacturing a semiconductor device including the steps of forming a metallic silicide element on a semiconductor wafer, providing an electrically insulating layer over the wafer, exposing a region of the metallic silicide element via a hole in the electrically insulating layer, annealing the wafer in nitrogen whereby to locally nitride the exposed metallic silicide region, metallising the wafer, and patterning the metallisation to form a metal element, the metallic silicide element being in electrical contact with the metal element via the locally nitrided metallic silicide region.

According to a further aspect of the present invention there is provided a method of manufacturing a semiconductor device including the step of forming a titanium disilicide interconnect, locally nitriding a region of the interconnect and disposing an aluminium element in electrical contact with the nitrided region.

BRIEF DESCRIPTION OF THE DRAWINGS

The accompanying drawing shows a cross-section through part of a semiconductor device.

DESCRIPTION OF THE PREFERRED EMBODIMENTS

Titanium nitride is known to be a good barrier to silicon diffusion while still having an acceptably low resistivity. It is thus proposed to selectively form titanium nitride at points where electrical contact between aluminium metallisation and underlying titanium silicide is required. The silicide provides a low resistivity interconnect while the nitride provides the ideal contact material to aluminium, having a low contact resistance and preventing silicon diffusing up into the aluminium.

The titanium nitride can be formed in a simple manner with only minimal disturbance to the conventional MOS Process.

In the accompanying drawing reference numeral 1 indicates a titanium disilicide interconnect extending over a substrate 2 (wafer) including active components (not shown) of an integrated circuit. Such an interconnect 1 is manufactured by forming a layer of titanium disilicide over the substrate 2 and subsequent patterning thereof. After patterning the silicide, a thick oxide (silicon dioxide) layer 3 is provided over the entire wafer. Holes such as 4 are then cut (etched) in layer 3 to expose the silicide 1. The processing steps outlined above are those of the normal MOS Process. The next step, which is not part of the normal MOS Process, comprises annealing the wafer in nitrogen. The nitrogen reacts with silicide exposed by the holes 4 to form titanium nitride regions (contacts) 5 thereat. The only exposed silicide is in the contact holes 4. Following this anneal, aluminium is deposited as in the normal MOS process, resulting in layer 5 which can be subsequently patterned as in the normal process.

The annealing in nitrogen may involve, for example, a temperature of 1000° C. for one hour, or alternatively 1100° C. for a few seconds. Both processes result in the formation of an adequate titanium nitride region 5.

TECHNICAL ADVANTAGES OF THE INVENTION

The method proposed involves selectively nitriding a low resistivity silicide interconnect by annealing it in nitrogen to form a low resistivity nitride region which forms a barrier to silicon diffusion. The process used to form the nitride layer is simple and achieves a truly self-aligned barrier.

We claim:

1. A method of manufacturing a semiconductor device including the steps of forming a titanium disilicide element on a semiconductor wafer, providing an electrically insulating layer over the wafer, exposing a region of the titanium disilicide element via a hole in the electrically insulating layer, annealing the wafer in nitrogen whereby to form titanium nitride at the exposed titanium disilicide region, metallizing the wafer, and patterning the metallization to form a metal element, the titanium disilicide element being in electrical contact with the metal element via the titanium nitride, which titanium nitride comprises a barrier to the diffusion of silicon from the wafer into the metal element.

2. A method as claimed in claim 1 wherein the insulating layer is of silicon dioxide.

3. A method as claimed in claim 1 wherein the metalisation is of aluminium.

4. A method of manufacturing a semiconductor device including the steps of forming a titanium disilicide interconnect on a substrate, annealing a region of the interconnect in nitrogen to form titanium nitride at the region and disposing an aluminium element in electrical contact with the titanium nitride, which titanium nitride comprises a barrier to the diffusion of silicon from the substrate into the aluminium element.

5. A method as claimed in claim 1, wherein the titanium nitride-forming annealing step involves pulse heating the wafer to a temperature of 1100° C. in nitrogen for a time of the order of a few seconds.

6. A method as claimed in claim 1, wherein the titanium nitride-forming annealing step involves heating the wafer to a temperature of 1000° C. in nitrogen for a time of the order of one hour.

* * * * *